United States Patent [19]
Halling et al.

[11] Patent Number: 5,998,798
[45] Date of Patent: Dec. 7, 1999

[54] ION DOSAGE MEASUREMENT APPARATUS FOR AN ION BEAM IMPLANTER AND METHOD

[75] Inventors: Alfred Mike Halling, Danvers; Wade Krull, Marblehead, both of Mass.

[73] Assignee: Eaton Corporation, Cleveland, Ohio

[21] Appl. No.: 09/095,863

[22] Filed: Jun. 11, 1998

[51] Int. Cl.$^6$ ............................................. H01J 37/317
[52] U.S. Cl. .............................. 250/492.21; 250/492.2; 250/252.1
[58] Field of Search ........................... 250/492.21, 492.2, 250/397, 398, 252.1

[56] References Cited

U.S. PATENT DOCUMENTS

| | | |
|---|---|---|
| 4,539,217 | 9/1985 | Farley . |
| 4,587,433 | 5/1986 | Farley . |
| 5,130,552 | 7/1992 | Bright et al. ......................... 250/492.2 |

*Primary Examiner*—Kiet T. Nguyen
*Attorney, Agent, or Firm*—Watts, Hoffmann, Fisher & Heinke, Co., L.P.A.

[57] ABSTRACT

An ion implanter includes an dosage control apparatus for measuring and controlling ion beam dosage applied to workpieces disposed in an implantation station of the implanter. The dosage control apparatus permits the direct calculation of a calibration function. The calibration function includes at least one calibration factor, called a K value. The K value is used by dosage control circuitry of the dosage control apparatus to convert from a measured ionized beam current, $I^f$, as measured by a Faraday cage disposed in the implantation station, to a true or effective beam current, $I^T$. The K value is determined from a relationship between the measured ionized beam current, $I^+$, and a pressure, P, in the implantation station. The relationship between the effective beam current, $I^T$, the measured ionized beam current, $I^f$, and the implantation station pressure, P, will normally take the form of an exponential relationship, e.g., $I^T = I^f [e^{-(KP)}]$. The K value is determined by measuring the pressure and corresponding ionized beam currents $I^{f+}$, for several pressures and applying a curve fitting algorithm to determine the K value that best fits the data points. The effective beam current, $I^T$, accounts for neutral atoms in the ion beam which are effective species in the implantation of the workpieces but that are not measured by the Faraday cage. The K value depends upon particular gas encountered along the ion beam beam line. Thus, different K values are advantageously calculated during calibration for different residual gas components expected during a production run. During a production run, the proper K value or values are selected and used by the dosage control electronics to determine the effective beam current of the ion beam and, thereby, to accurately control ion beam dosage utilizing the effective beam current. During a calibration run, a restriction plate having a narrow aperture is positioned in the beam line between an ion beam source and the implantation station.

19 Claims, 5 Drawing Sheets

ION DOSAGE MEASUREMENT APPARATUS FOR AN ION BEAM IMPLANTER AND METHOD

FIELD OF THE INVENTION

The present invention relates to an ion beam implanter and, more particularly, an apparatus and method for measuring and controlling ion dosage implanted in a workpiece exposed to an ion beam of an ion beam implanter.

BACKGROUND OF THE INVENTION

Ion beam implanters are widely used in the process of doping of semiconductor wafers. An ion beam implanter generates an ion beam comprised of desired species of positively charged ions. The ion beam impinges upon an exposed surface of a semiconductor wafer workpiece thereby "doping" or implanting the workpiece surface with desired ions. Some ion beam implanters utilize serial implantation wherein a single semiconductor wafer workpiece is positioned on a support in an implantation chamber. The support is oriented such that the workpiece is in the ion beam beam line and the ion beam is repetitively scanned over the workpiece to implant a desired dosage of ions. When implantation is complete, the workpiece is removed from the support and another workpiece is positioned on the support.

Another type of ion beam implanter uses a rotating, translating disk-shaped support on which workpieces are mounted. A plurality of semiconductor workpieces are mounted on the disk-shaped support. The support is supported in an implantation chamber of an end or implantation station of the ion beam implanter. The rotation and translation of the support allows each of the plurality of workpieces to be exposed to the ion beam during a production run.

Faraday cages, which trap ions of the ion beam while blocking the escape of electrons from within the cage and excluding electrons which might accompany the beam, are universally used to measure ion beam current and thereby facilitate control of implantation dose. However, neutral atoms in the ion beam are not detected by the Faraday cage. If significant neutralization of the ion beam occurs, the Faraday cage ion beam current reading will give a false measure of the true ion implantation received by the workpieces.

Accuracy in quantity of ions implanted in the semiconductor wafer workpieces during the implantation process is of critical importance. The allowable tolerances on uniformity and total implantation dose in the manufacturing of semiconductor devices are now at the 1% level or lower in many applications. At these low tolerance levels, it is necessary to take into account the neutralization of the ions along the ion beam path. Neutralization of ions results from collisions of charged ions with residual atoms and electrons present in the interior region of the ion beam implanter along the beam path or beam line. Such neutralized ions have essentially the same energy as the charged ions and are essentially equivalent to them insofar as implantation dose is concerned.

Residual atoms in the ion beam implanter interior region and, particularly, residual gas atoms in the interior region result from at least three different sources. First, gas is injected into the interior region in connection with an ion beam neutralizer or electron shower. An ion beam neutralizer is disposed along the beam line and neutralizes the positively charged ions of the ion beam prior to implantation. If the positive charge on the ions is not neutralized prior to implantation of the wafers, the doped wafers will exhibit a net positive charge. Such a net positive charge on a wafer workpiece has undesirable characteristics. A neutralization gas is injected into the ion beam electron shower, collisions between the ion beam ions and the injected neutralization gas result in neutralized ions in the beam line. In certain ion beam implanters, neutralization gas associated with the ion beam neutralizer accounts for the greatest volume of residual gas in the ion beam implanter interior region. Typical neutralization gases include xenon (Xe) and Argon (Ar).

Accounting for the second greatest volume of residual gas in the ion beam implanter interior region in certain ion beam implanters is outgassing from photoresist material coated on the semiconductor wafer workpieces. In certain ion beam implanters, photoresist material outgassing accounts for the greatest volume of residual gas. As the ion beam impinges on the workpiece surfaces, the photoresist material is volatized or outgassed. Photoresist outgas is mainly comprised of hydrogen gas ($H_2$), a variety of hydrocarbons, with a small amount of atmospheric nitrogen gas ($N_2$) trapped by the photoresist.

A much smaller source of residual gas in the ion beam interior region results from source gas which escapes from a plasma chamber of the ion source. Source gases are injected into and are ionized within the plasma chamber. Ions escaping the plasma chamber through an opening or arc slit in a cover of the plasma chamber are accelerated along the ion beam beam line. A small amount of the source gas escapes through the arc slit and accounts for a low portion of the residual gas in the ion beam implanter interior region. Typical examples of source gases include arsine ($AsH_3$), vaporized antimony (Sb), phosphine ($H_3P$), diborane ($B_2H_6$), boron triflouride ($BF_3$), vaporized gallium (Ga), vaporized indium (In), ammonia ($NH_3$), hydrogen ($H_2$) and Nitrogen ($N_2$).

When the pressure in the interior region of the implanter along the beam line is low enough, the implanter species is essentially a singly charged positive ion selected by an analyzing magnet of the ion beam implanter. The analyzing magnet is positioned along the beam line and causes the ion beam to curve toward the implantation chamber. The strength and direction of the magnetic field of the analyzing magnet is set such that only ion species with a proper atomic weight are deflected at the proper radius of curvature to follow the desired beam line path to the implantation chamber. If, however, the pressure in the interior region of the ion beam implanter along the beam line is not low enough, a significant proportion of charged ions of the ion beam will undergo a change in their charge state through atomic collisions with the residual gas atoms, without undergoing a significant change in energy. In such circumstances, the ion beam striking the Faraday cage will contain a portion of neutral atoms. These neutralized atoms are the desired species and have the desired energies for implantation, thus, such neutralized atoms should be counted in a total flux of the ion beam. However, the Faraday cage is not capable of counting such neutralized atoms.

U.S. Pat. No. 4,539,217 to Farley, issued on Sep. 3, 1985, discloses a method and apparatus to compensate for neutralization of the ion beam in the implantation process. The Farley patent is assigned to the assignee of the present application and is fully incorporated by reference herein. The Farley patent utilizes the fact that the amount of ion beam neutralization is a function of the gas pressure in the interior region of the ion beam implanter along the ion beam beam line. Further, according to the Farley patent, the effective ion beam current, $I^T$, is comprised of two components, the ion beam ionized singly positive charged current, $I^+$, and the ion beam neutral current, $I^0$. The effective ion beam current, $I^T$, is a measure of current efficacious in the implantation of workpieces, regardless of charge of the implanted particles. Thus both the ionized ion beam current, $I^+$, and the ion beam neutral current, $I^0$, should be considered in determining the ion dosage a particular workpiece has received. The Farley patent assumes that the current measured by the Faraday cage, $I^f$, is comprised solely of the ionized singly positive charged current, $I^+$.

The second component of the true or effective ion beam current, $I^T$, i.e., the neutral current, $I^0$, is not measured by the Faraday cage. The atoms comprising the neutral current, $I^0$, however, are just as effective in implanting the semiconductor wafer workpieces as are the ions comprising the ionized positive charged current, $I^+$. Further, the greater the gas pressure in the ion implanter interior region, the greater the neutral current, $I^0$, will be because of more collisions between ions and gas atoms and the smaller the ionized positive charged current, $I^+$ will be. The Farley patent assumes that within a range of pressures encountered in the implantation process, the ion beam current measured by the Faraday cage $I^f$, is a linear function of the pressure, P, of the ion implanter interior region.

The method disclosed in the Farley patent compensates for differential between the effective ion beam current, $I^T$, and the ionized beam current, $I^+$. The measurement of the ionized positive charged current, $I^+$, and pressure, P, in the interior region of the ion implanter is used in an ion dosage control system to generate a calibration signal which compensates for the change in ions detected by the Faraday cage as the implanter interior region pressure varies. The calibration signal for a particular production run depends upon a selected calibration factor or "K" value.

The Farley patent method of controlling ion beam dose included the steps of:

1) measuring the ionized beam current, $I^+$, incident on a wafer workpiece using a Faraday cage;

2) measuring the gas pressure P within the implantation chamber;

3) using a relationship to convert the ionized beam current, $I^+$, and the pressure measurement P into a true or effective beam current, $I^T$, and 4) varying the dose of implantation as a function of the effective beam current, $I^T$.

The true or effective ion beam current, $I^T$, was then input to a microprocessor based implanter dose control system for use in accordance with known practices for monitoring and control of implantation dose.

According to the Farley patent, a linear equation used to convert the ionized ion beam current, $I^+$, into an effective ion beam current, $I^T$, is:

$$I^T = I^+[1+KP]$$

Two modes of implanter operation were set forth in the Farley patent. In the first or fixed mode, a set of K values were estimated for different combinations of ion beam parameters and wafer workpiece parameters. The set of K values were stored in microprocessor memory and an appropriate value of K extracted from memory when the ion beam and workpiece characteristics were input to the microprocessor. In a second or dynamic mode of operation, a starting K value was selected, the K value was modified after each full rotation of the workpiece support. Upon each revolution of the workpiece support, the ionized beam current, $I^+$, and the pressure P were measured and a value of K, called $K_j$, was calculated ($K_j$ being the value of K for the jth rotation of the support). A moving average of the three most recent Kj's ($K_j$, $K_{j-1}$, and $K_{j-2}$) was found and the moving average value, called $K_j^A$, was used to calculate a new effective beam current for the jth support revolution, called $I_j^T$.

In either mode of operation, an initial value of K must be provided to the dosage control system. Since K values were empirically estimated for different source gas/workpiece material combinations, a test implant matrix had to be generated for each source gas and each semiconductor wafer material. There was no assurance that any particular empirically determined K value was optimal or near optimal for the source gas/wafer material combination. Further, actual semiconductor wafers were used in testing to empirically determine K values. The testing resulted in the improper implantation of numerous wafers. Such semiconductor wafers have a significant cost per wafer and improper wafer implantation results in a significant scrap loss. Moreover, valuable production time is lost during testing runs in trying to find near acceptable K values for different ion beam parameters and wafer workpiece parameters.

What is needed is an effective ion beam dosage control apparatus for an ion implanter. What is also needed is an apparatus and process for efficiently determining optimal or near optimal K values which can be used to control ion beam dosage applied to workpieces. What is further needed is an apparatus and process for determining optimal K values without using actual semiconductor wafers.

SUMMARY OF THE INVENTION

In accordance with the present invention, an ion beam implanter for directing an ion beam against one or more semiconductor wafer workpieces is disclosed. The ion implanter includes an implantation station defining an implantation chamber. One or more workpieces are supported on a support disposed within the implantation chamber. The ion implanter further includes an ion source generating the ion beam and beam forming and directing apparatus defining an interior region through which the ion beam passes from the ion source to the implantation station. A pressure regulation system is provided for pressurizing and depressurizing the interior region.

The implanter also includes a novel dosage control apparatus for controlling a dosage of ions implanted into a workpiece. The dosage control apparatus includes a pressure measuring apparatus for measuring a pressure in the implantation chamber and an ion beam current measuring apparatus for measuring an ionized current of the ion beam in the implantation chamber. The dosage control apparatus further includes a restriction plate having an aperture. The restriction plate is movable between a production run position and a calibration run position. In the production run position, the restriction plate is away from a beam line of the ion beam. In the calibration run position, the restriction plate is positioned in the beam line such that a portion of the ion beam traverses the restriction plate aperture and is directed against the workpieces in the implantation chamber.

In the calibration run position, the restriction plate seals against the beam forming and directing apparatus to divide the interior region into a first region including the implantation chamber and a second region including the ion source. The pressure regulation system is actuated such that the first region is pressurized to a first pressure and the second region having a second pressure.

The dosage control apparatus further includes dosage control circuitry coupled to the pressure regulation system, pressure measuring apparatus and ion beam current measuring apparatus. The dosage control circuitry operates during a calibration run to calculate a calibration value ("K" value) correlating the ionized beam current to an effective ion beam current for a particular test gas which simulates an expected residual gas during a production run.

The ion implanter dosage control circuitry calculates the calibration value by changing the first pressure between a plurality of pressure values using a selected gas (or gas mixture) and, for each pressure value, determining the corresponding ionized beam current value (that is, the Faraday cage current). Using curve-fitting data analysis software, the dosage control circuitry fits a function to the data points of measured pressure versus Faraday cage ion beam current, If, and determines the K factor for the test gas. The test gas selected should replicate one or more components of the residual gas that is expected to be present in the ion implanter interior region during a production run.

The dosage control circuitry operates during a production run to control ion dosage received by each of the plurality of workpieces using one or more predetermined calibration values, a measured implantation chamber pressure and a measured ionized beam current to calculate an effective ion beam current. If more than one K value is used to calculate effective ion beam current, an approximation must be made as to a proportion of the total pressure in the implanter interior region is accounted for by each gas component corresponding to a K value.

These and other objects, features and advantages of the invention will become better understood from the detailed description of the preferred embodiments of the invention which are described in conjunction with the accompanying drawings.

DETAILED DESCRIPTION

Structure of Ion Beam Implanter 10

Figure 1:
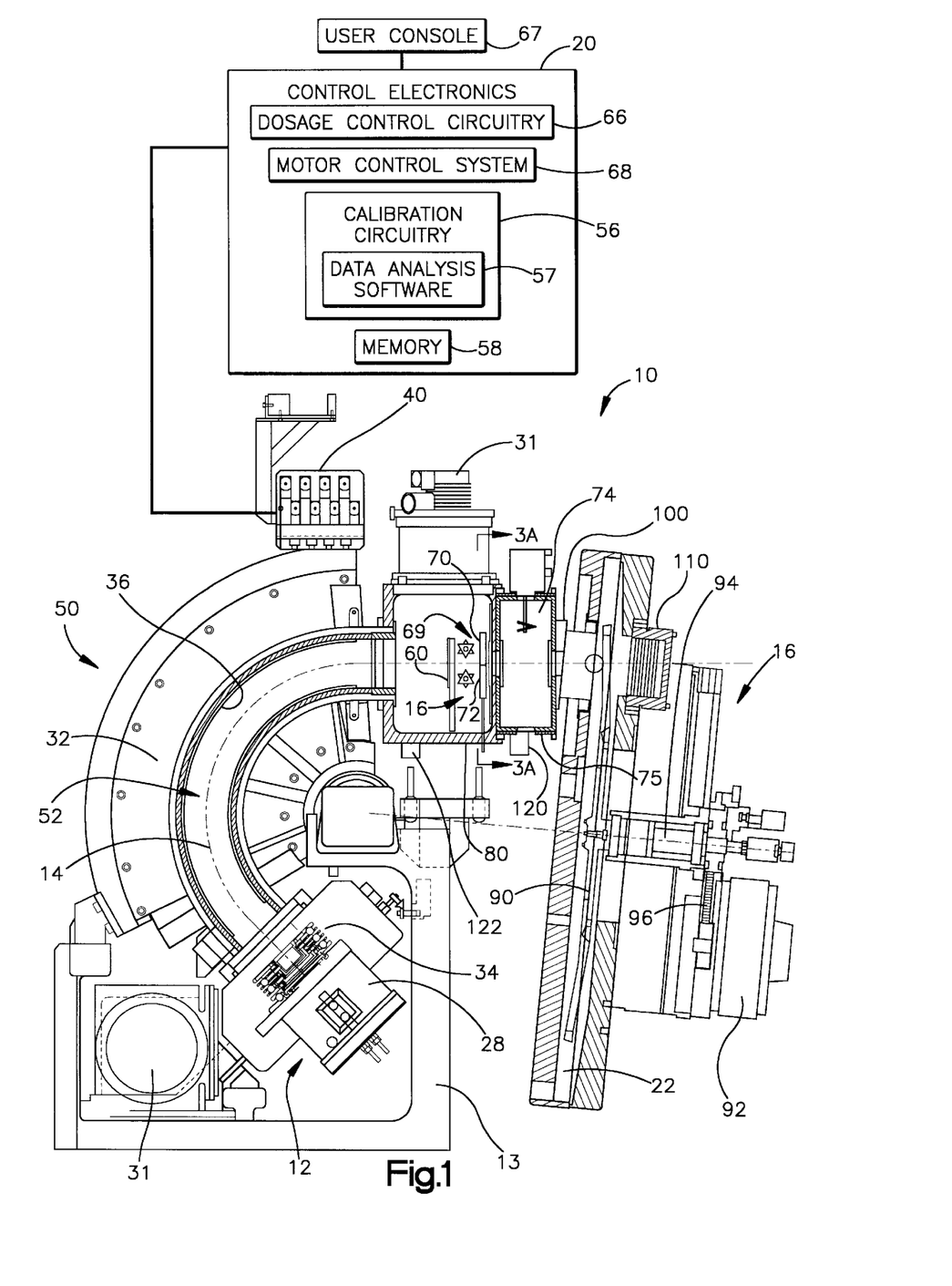
FIG. 1 is a schematic top plan view of an ion beam implanter of the present invention.

An ion beam implanter is shown generally at 10 in FIG. 1. The implanter 10 includes an ion source 12 mounted to an "L" shaped support 13 for providing ions that form an ion beam 14 which traverses a beam path to an implantation or end station 16. Control electronics (shown schematically at 20) are provided for monitoring and controlling the ion dosage received by a plurality of semiconductor wafer workpieces 21 (FIG. 2) within an implantation region or chamber 22 of the implantation station 16. Operator input to the control electronics 20 is performed via a user console 67.

The ion source housing 12 generates the ion beam 14 which impacts the wafer workpieces 21 disposed on a rotating and translating disk-shaped support 90 in the implantation chamber 22. Although a rotating, translating support 24 is disclosed, it should also be appreciated that the present invention is equally applicable to a "serial" ion beam implanter, that is, one in which the ion beam is directed to scan over the surface of a stationary workpiece. The ions in the ion beam 14 tend to diverge as the beam traverses a distance between the ion source 12 and the implantation station 16. The ion source 12 includes a plasma chamber 28 defining an interior region into which source materials are injected. The source materials may include an ionizable gas or vaporized source material. Source material in solid form is deposited into a vaporizer which is then injected into the plasma chamber 28. If an n type extrinsic wafer material is desired, boron (B), gallium (Ga) or indium (In) will be used. Gallium and indium are solid source materials, while boron is injected into the plasma chamber 28 as a gas, typically boron trifluoride ($BF_3$) or diborane ($B_2H_6$), because boron's vapor pressure is too low to result in a usable pressure by simply heating solid boron.

Figure 2:
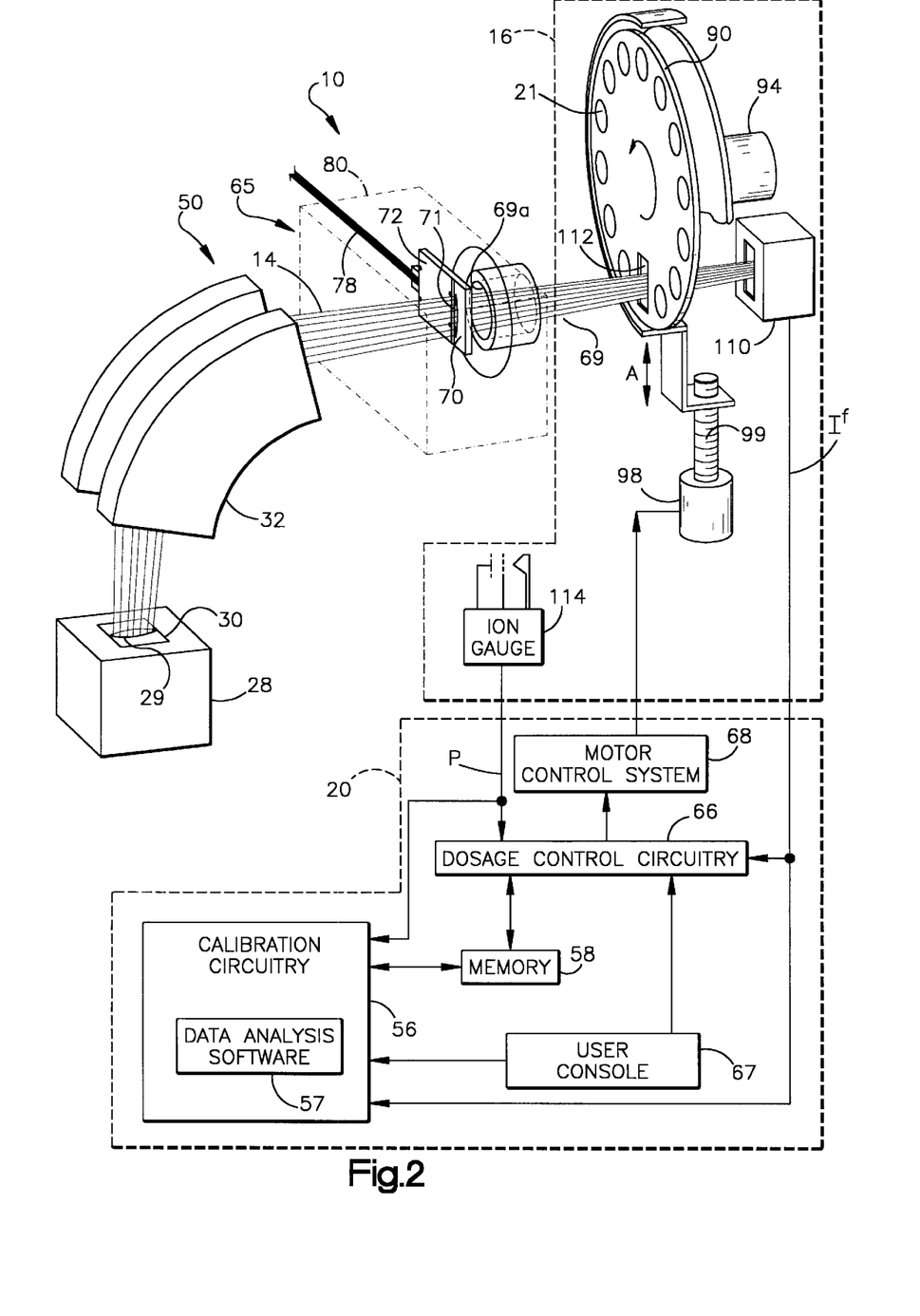
FIG. 2 is a schematic perspective view of selected components of the ion beam implanter of FIG. 1.

If a p type extrinsic material is to be produced suitable source materials include source gases arsine ($AsH_3$)and phosphine ($H_3P$) and vaporized solid antimony (Sb). Energy is applied to the source materials to generate positively charged ions in the plasma chamber 28. As can be seen in FIG. 2, the positively charged ions exit the plasma chamber 28 through an elliptical arc slit 29 in a cover plate 30 overlying an open side of the plasma chamber 28.

During a production run, that is, when semiconductor wafer workpieces 21 are being impinged upon by the ion beam 14 and thereby being implanted with ions, the ion beam 14 travels through an evacuated path from the ion source 12 to an implantation chamber 22, which is also evacuated. Evacuation of the beam path is provided by a pressure regulation system 55 comprising a pair of vacuum pumps 31. One application of an ion source 12 constructed in accordance with the present invention is for a "low" energy implanter. The ion beam 14 of this type of implanter tends to diffuse over its beam path and hence the implanter 10 has been designed to have a relatively "short" path from the source 12 to the implantation chamber 22.

Ions in the plasma chamber 28 are extracted through the arc slit 29 of the plasma chamber cover plate 30 and are formed into the ion beam 14 that traverses the distance between the ion source 12 and the implantation station 16 by beam forming and directing structure 50. The beam forming and directing structure 50 includes a mass analyzing or resolving magnet 32 and a set of electrodes 34. The plasm chamber ions are accelerated by the set of electrodes 34 adjacent the plasma chamber toward the mass analyzing magnet 32 fixed to the support 24. The set of electrodes 34 extract the ions from the plasma chamber interior and accelerate the ions into a region bounded by the mass analyzing magnet 32. An ion beam path through the magnet region is bounded by an aluminum beam guide 36. During production runs, an interior region 52 (FIG. 1) defined by the beam forming and directing structure 50 is evacuated by the pumps 31.

Ions that make up the ion beam 14 move from the ion source 12 into a magnetic field set up by the mass analyzing magnet 32. The strength and orientation of the magnetic field produced by the analyzing magnet 32 is controlled by the control electronics 20 coupled to a magnet connector 40 (FIG. 1) for adjusting a current through the magnet's field windings.

The mass analyzing magnet 32 causes only those ions having an appropriate mass to charge ratio to reach the ion implantation station 16. The ionization of source materials in the plasma chamber 28 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation.

The magnetic field generated by the mass analyzing magnet 32 causes the ions in the ion beam 14 to move in a curved trajectory. The magnetic field that is established by the control electronics 20 is such that only ions having an atomic mass equal to the atomic mass of the desired ion species traverse the curved beam path to the implantation station implantation chamber 22.

Located downstream from the analyzing magnet 32 is a resolving plate 60 (FIG. 1). The resolving plate 60 is comprised of vitreous graphite and defines an elongated aperture through which the ions in the ion beam 14 pass. At the resolving plate 60, the ion beam dispersion, that is, a width of the ion beam envelope, is at a minimum for production runs.

The resolving plate 60 functions in conjunction with the mass analyzing magnet 32 to eliminate undesirable ion species from the ion beam 14 which have an atomic mass close to, but not identical, to the atomic mass of the desired species of ions. As explained above, the strength and orientation of the mass analyzing magnet's magnetic field is established by the control electronics 20 such that only ions having an atomic weight equal to the atomic weight of the desired species will traverse the predetermined, desired beam path to the implantation station 16. Undesirable species of ions having an atomic mass much larger or much smaller than the desired ion atomic mass are sharply deflected and impact the beam guide 36 or the slit boundary defined by the resolving plate 60.

The beam forming and directing structure 50 also includes a beam neutralizer 74, commonly referred to in the art as an electron shower. The ions extracted from the plasma chamber 28 are positively charged. If the positive charge on the ions is not neutralized prior to implantation of the wafers, the doped wafers will exhibit a net positive charge. Such a net positive charge on a wafer workpiece has undesirable characteristics.

A downstream end of the beam neutralizer 74 is adjacent the implantation chamber 22 where the semiconductor wafer workpieces 21 are implanted with ions. Supported within the implantation chamber is a disk-shaped semiconductor wafer workpiece support 90. Wafer workpieces 21 to be treated are positioned near an outer edge of the wafer support 90 and the support is rotated at a constant angular velocity by a motor 92. An output shaft of the motor 92 is coupled to a support drive shaft 94 by a belt 96. The ion beam 14 strikes the wafer workpieces as they rotate in a circular path. A stepper motor 98 also drives a lead screw 99 to translate the support 90 vertically (shown by arrow labeled "A" in FIG. 2). This permits multiple rows of semiconductor wafers to be implanted during a production run. Ion dosage received by the workpieces 21 determined by the velocity of translation of the support 90 under the control of the control electronics 20. The implantation station 16 is pivotable with respect to the beam neutralizer housing 75 by a flexible bellows 100 (FIG. 1).

Ion Beam Dose Control Assembly 65

The ion implanter 10 includes a novel ion beam dosage control assembly 65 (FIG. 2). The dosage control assembly 65 functions in two modes: a calibration mode and a production run mode. In the calibration mode, calibration circuitry 56 is utilized to obtain a calibration constant value, called the K value, for a specific test gas. Different calibration K values may be calculated by the calibration circuitry 56 for different test gases depending on the composition of the expected residual gas during a production run. During a production run, dosage control circuitry 66 utilizes one or more of the K values to accurately control ion dosage received by the workpieces 21. Essentially, the dosage control circuitry 66 makes use of the calibration constants, that is, the K values to compensate for the effect of the residual gases in the ion beam implanter interior region 52 on the implantation process during a production run.

A test gas selected during the calibration mode is designed to replicate one or more residual gases expected to be present during a production run. While the pumps 31 evacuate the beam forming and directing structure interior region 52 during a production run, residual gases remain. Each residual gas impacts workpiece ion implantation in a different way during a production run. Depending on the volume and characteristics of a residual gas in the interior region 52, its effect on implantation may or may not be significant. If the expected volume and characteristics of a residual gas make it desirable to account for its effects during a production run, a K value corresponding to that gas will have been calculated and stored in a memory 57 during a prior calibration run and that value will be used by the dosage control circuitry 66 to control implantation dosage during the production run.

Figure 3A:
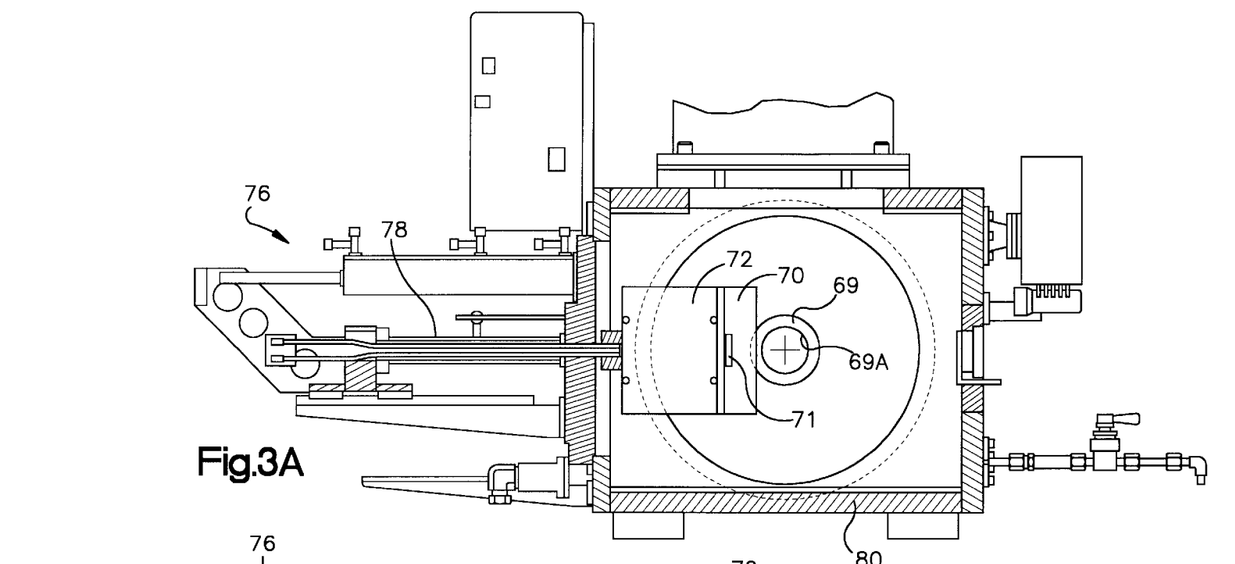
FIG. 3A is a sectional view of an ion beam dose measurement and calibration assembly as seen from a plane indicated by the line labeled 3A—3A in FIG. 1.
Figure 3B:
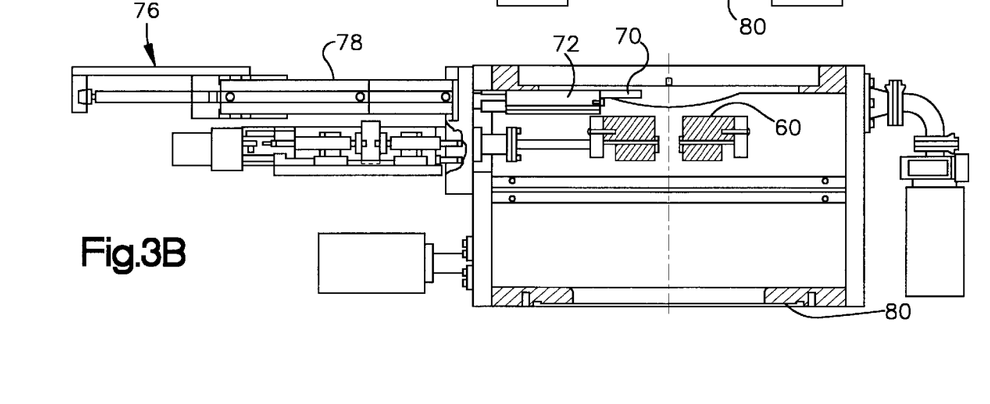
FIG. 3B is another sectional view of the ion beam dose measurement and calibration assembly.

The dosage control assembly 65 includes a movable restriction plate 70. The restriction plate 70 is attached to an end of a Faraday flag 72 and is movable into and out of the ion beam beam line by a lever assembly 76. In FIGS. 3A and 3B the restriction plate 70, which is preferably made of vitreous graphite, and the Faraday flag 72, which is metal coated with graphite, are out of the ion beam beam line. In FIG. 2, the restriction plate 70 is in the beam line. Those skilled in the art will recognize that other constructions of the restriction plate 70 are possible other than being attached to the Faraday flag 72. Of importance is that the restriction plate 70 is selectively movable into and out of the beam line 14. When moved into the beam line 14 during operation of the implanter 10 in the calibration mode, the ion beam 14 is directed or resolved through an opening or aperture 71 of the restriction plate 70 and, further, when the restriction plate 70 is in the beam line 14, the restriction plate abuts portions of the beam forming and directing structure 50 forming two subregions within the implanter interior region 52.

The dosage control assembly 65 also includes a ion beam current measuring apparatus, preferably, a Faraday cage 110 and a pressure measurement apparatus, preferably, an ion gauge 114 (FIG. 2) disposed in the implantation chamber 22. The dosage control assembly 65 further includes a pair of gas flow pumps 120, 122 (FIG. 1) which are also part of the pressure regulation system 55. The dosage control assembly 65 also includes calibration circuitry 56, a memory 58, pressure compensating dosage control circuitry 66, and a motor control system 68, all of which are part of the control circuitry 20.

The Faraday cage 110 is mounted behind the workpiece support 90 and is used to measure ion beam current, $I^f$, which passes through a slot 112 formed in the support 90. The slot 112 is also part of the dosage control assembly 65. The Faraday cage 110 measures only a portion of an effective ion beam current, $I^T$, received by the semiconductor wafer workpieces 21. The ion beam 14 is comprised primarily of positive ions and has an incident ion current that will be designated $I^T$. The ion beam current measured by the Faraday cage 110 will be designated $I^f$. The collisions of the primarily positive ion beam 14 with residual gas atoms remaining along the evacuated beam line in the interior region 52 causes electrons to be added or taken away from some of the positive ions with probabilities which depend on the ion species, the ion velocity and the gas through with the ion passes. The resulting effective ion beam current, $I^T$, at the implantation surface of the workpieces 21 has components with different charges:

$$I^T = I^0 + I^- + I^+ + I^{++} + \ldots$$

where:
- $I^0$ = ion beam current component comprising neutral particles
- $I-$ = ion beam current component comprising singly charged negative ions
- $I^+$ ion beam current component comprising singly charged positive ions
- $I++$ = ion beam current component comprising doubly charged positive ions Each of these ion beam components is effective for implantation of the workpieces 21 but not all are measured equally by the Faraday cage 110. The Faraday cage ion beam current, $I^f$, includes all the positive ion beam current components including $I^+$, $I^{++}$, $I^{+++}$, etc. as well as the negative ion beam current component $I^-$ The Faraday cage ion beam current, $I^f$, does not include $I^0$ or $I^-$.

A major source of residual gas within the implanter interior region 52 during a production run is the beam neutralization gas pumped into the beam neutralizer housing 75. Typically, this is xenon or argon gas. The beam neutralization gas is used for charging control of the ion beam 14. Depending on the implantation, other gases suitable for used as beam neutralization gas include. As implanters such as the implanter 10 are utilized at lower beam energies to facilitate production of higher density semiconductor integrated circuit chips, the beam neutralization gas will account for a majority of the residual gas present in the implanter interior region 52 during implantation.

Accounting for the either the second greatest volume of residual gas in the interior region of such low energy ion implanters as the implanter 10 during a production run is gas generated from volatilization of photoresist material coated on the semiconductor wafer workpieces. As the ion beam impinges on the workpiece surfaces, the photoresist material is volatized or outgassed.

A much smaller source of residual gas in the ion beam interior region 52 during a production run results from source gas which escapes from the ion source plasma chamber 28. Source gases are injected into the plasma chamber 28 and are ionized. The set of electrodes 34 direct positively charged ions escaping through the plasma chamber cover arc slit 29 along the ion beam beam line. A small amount of the source gas escapes through the arc slit and accounts for a small portion of the residual gas in the ion beam implanter interior region. Typical examples of source gases include arsine, phosphine, vaporized antimony, diborane, boron triflouride, vaporized gallium and vaporized indium.

As will be explained below, the composition of residual gas expected during a production run can be determined based on: a) knowing the neutralization gas used in the ion beam neutralization process; b) knowing whether the workpieces 21 are coated with a photoresist material; and c) knowing what source gas or gases are being used. Calibration is done using test workpieces instead of actual semiconductor wafer workpieces 21 to avoid the cost associated with improperly implanted workpieces which must be scrapped.

A different K value will be determined for each test gas. The composition of the residual gases expected during a production run is estimated and for each residual gas, a determination must be made as to each residual gas component as to whether or not the expected volume and characteristics of that gas component render it important enough to be accounted for or compensated for during the production run. That is, as to each residual gas component, it must be determined if that gas component will significantly effect implantation dosage of the workpieces 21 and, therefore, make it desirable to include the gas component in the compensation process undertaken by the dosage control circuitry 66. Once the K value for an expected, significant residual gas component is calculated by the calibration circuitry 56, it is stored in the memory 58 and is utilized by the dosage control circuitry 66 to determine the effective ion beam current, $I^T$. The effective ion beam current, $I^T$, is calculated by the dosage control circuitry 66 based on the measured pressure, P, in the implantation chamber 22 and the Faraday cage ion current, $I^f$ and is used by the dosage control circuitry 66 to accurately control the ion beam dosage received by the plurality of semiconductor wafer workpieces 21. It should be appreciated that a calibration run is not required for each production run provided that the appropriate K values for the anticipated, significant residual gases have previously been stored in the memory 58 by the calibration circuitry 56.

A pressure, P, of the implantation station 22 is measured by the ionization gauge 114 placed within the implantation chamber 22. The first gas flow controller 120 (FIG. 1) is in fluid communication with an interior region defined by the beam neutralizer housing 80 and the implantation chamber 22. Operating under the control of the calibration circuitry 56, the first gas controller 120 introduces and varies the pressure of a test gas in the implantation chamber 22 during the calibration mode of operation as will be described below. A second gas flow controller 122 is in fluid communication with an interior region defined by the beam forming structure 50 extending from the ion source 12 through the dose calibration assembly housing 80. Operating under the control of the calibration circuitry 56, the second gas controller 122 introduces a constant pressure test gas along the beam line upstream from the movable restriction plate 70 for calibration purposes.

Also affixed to the lever assembly 76 is the Faraday flag 72 and attached restriction plate 70 (FIGS. 3A and 3B). A lever 78 of the lever assembly 76 extends exteriorly of a resolving housing 80. The lever 78 is pivotable between three positions with respect to the resolving housing 80. In a first position of the lever 76, the restriction plate 70 and the Faraday flag 72 are out of the beam line of the ion beam 14. This is the position of the lever 78 during production runs and is shown in FIGS. 3A and 3B.

In the second or middle position of the lever 78, the movable restriction plate 70 is positioned to intersect the beam line of the ion beam 14. This is shown in FIG. 2. Only a small portion of the ions of the ion beam 14 are permitted to pass through the small rectangular aperture 71 of the restriction plate 70. In the currently preferred embodiment, the size of the aperture 71 is 4.0 centimeters (cm.) by 1.0 millimeter (mm.). It should be understood that other shapes of the aperture 71 beside rectangular may be advantageous.

An aperture region comprising a plurality of many small holes through the restriction plate 70 may prove advantageous under certain conditions.

Importantly, the restriction plate 70 seals against a cylindrical member 69 bridging the resolving housing 80 and the beam neutralizer housing 75. As can be seen in FIG. 3, the restriction plate 70 blocks an opening 69a of the cylindrical member 69. Because of the small size of the restriction plate aperture 71, the restriction plate 70 sealing against the cylindrical member 69, during the calibration mode, the interior region 52 defined by the beam forming and directing structure 50 is divided into two regions and a pressure differential is maintained in an upstream region of the interior region 52 versus a downstream region of the interior region 52. That is, during calibration, the implantation chamber 22 (downstream of the restriction plate 70) is varied or stepped between a plurality of pressures, while the upstream region (upstream of the restriction plate 71) is maintained at a constant pressure. The second position of the lever 78 is selected for the calibration mode of implanter operation prior to a production run.

In the third position of the lever 78, the Faraday flag 72 is positioned to intersect the ion beam 14 permitting measurement of certain ion beam characteristics during calibration prior to a production run and, when the measurements are satisfactory, the Faraday flag 72 is moved or swung out of the beam line by pivoting the lever 78 to the first position so that neither the movable restriction plate 70 nor the Faraday flag 72 is in the beam line during a production run.

Calibration of Ion Beam Dosage

Figure 4:
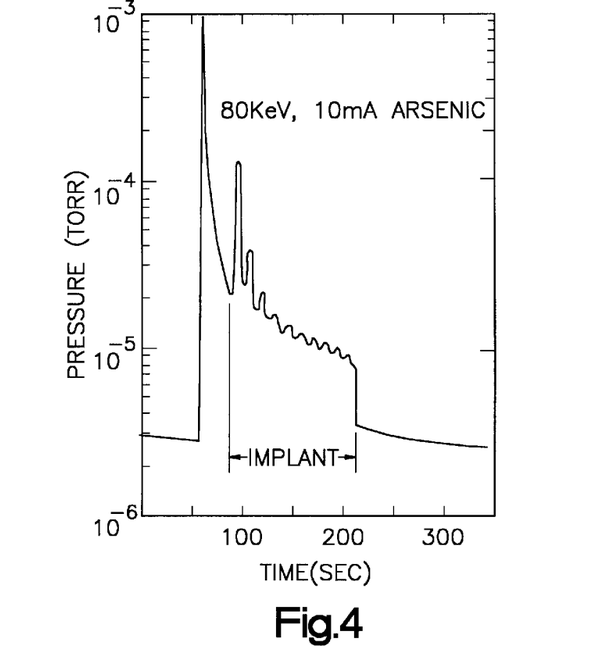
FIG. 4 is a graph showing pressure in an implantation chamber of the ion beam implanter of FIG. 1 as a function of time.

As shown in FIG. 4, the implantation station pressure varies as a function of time during pump-down and implantation (using arsenic as an example) of a batch of semiconductor wafer workpieces 21 covered with positive photoresist. The implantation station pressure oscillates in correspondence to the radial scans of the support 90 holding the semiconductor wafer workpieces 21. Large pressure changes of about a factor of 10 are observed during the first passes of the ion beam 14 across the workpieces 21.

The dosage control circuitry 66 of the present invention takes account of the pressure dependence of the charge-changing interactions which cause the effective incident ion beam current, $I^T$, at the implantation surface to fractionate into many different charged components. The singly ionized positive current, $I^+$, is measured by the Faraday cage 110. While dosage control method disclosed in the '217 Farley patent referenced above only takes into account the neutral beam current, $I^0$, and singly charged positive beam current, $I^+$, the dosage control method of the present invention takes into account all of the fractionate currents in compensating from pressure effects on the effective ion beam current, $I^T$.

Figure 5:
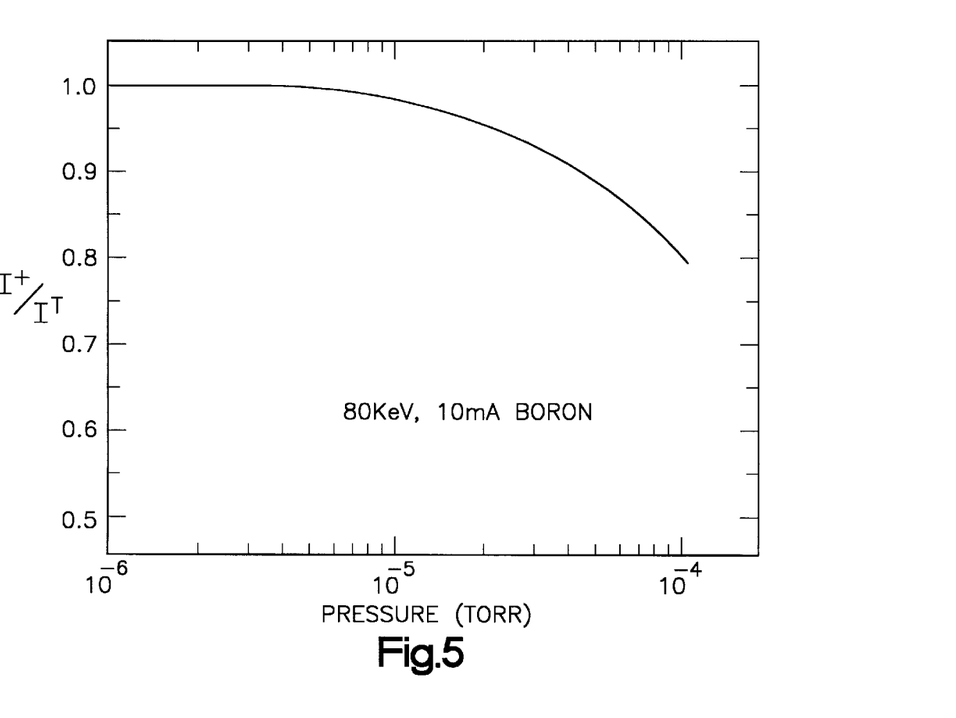
FIG. 5 is a graph showing a ratio of an ionized ion beam current to a effective beam current, $I^+/I^T$, as a function of the implantation chamber pressure, P.

FIG. 5 illustrates the variation in the ratio of the singly charged positive current, $I^+$, as measured by the Faraday cage 112 to the total implantation current, $I^T$, as a function of pressure measured by the ionization gauge 114. The ratio, $I^T/I^+$, declines exponentially with increasing pressure over the range of $10^{-6}$ to $10^{-4}$ torr so that at a pressure of $10^{-4}$ torr, the Faraday cage current reading, that is, the singly ionized positive current, $I^+$, is about 80% of the true current. A torr is a unit of pressure, equal to 1/760 atmosphere.

As is well known in the art, as gas pressure increases, the neutral current, $I^0$, increases while the ionized positive charged current, $I^+$, decreases until equilibrium values are reached. The equilibrium values depend primarily on the ion species and velocity.

Determination of Calibration Value

To calibrate the ion beam dosage, that is, to calculate one or more calibration values, K values, test implants are positioned on the wafer support 90 instead of actual semiconductor wafer workpieces. This saves the cost of ruining expensive semiconductor wafers during the calibration process. The lever 70 is moved to the second position, thereby causing the restricting plate 70 to overlie the opening 69a of the cylindrical member 69 extending between the resolving housing 80 and the beam neutralizer housing 75.

The first gas controller 120 injects a relatively high pressure of the xenon test gas into the implantation chamber 22. In order to determine the calibration value, K, the test gas pressure, P, of the implantation chamber 22 is ramped up to permit a series of measurements wherein the Faraday cage ion beam current, $I^f$, is measured as a function of the implantation chamber pressure, P.

The second gas flow controller 122 injects a constant gas pressure of the xenon test gas in the interior region upstream of the restriction plate 70. The test gas upstream of the restricting plate 70 functions to overwhelm the small leakage of high pressure gas from the implantation chamber 22 through the restricting plate aperture 71. It should be appreciated that in some cases, injection of the low pressure test gas upstream of the restriction plate 70 may not be needed if there is significant outgassing or leakage in the beamline region. Leakage occurs because of ion beam striking the beam guide, source gases escaping from the plasma chamber, etc. Ion beam flux is defined as the product of the number of particles per unit volume and their average velocity. Because the gas pressure upstream of the restriction plate 70 remains constant during the calibration process, the ion beam flux through the restriction plate aperture 71 is constant and does not vary with the test gas pressure, P, in the implantation chamber 22.

As the test gas pressure in the implantation chamber 22 is stepped up by the first gas flow controller 120 operating under the control of the calibration circuitry 56, the dosage control circuitry 66 stores both the measured implantation chamber pressure, P, and the Faraday ionized beam current, $I^f$, at a series of pressure levels. Preferably about 20 data points are taken and analyzed by the data analysis software 57.

Figure 6:
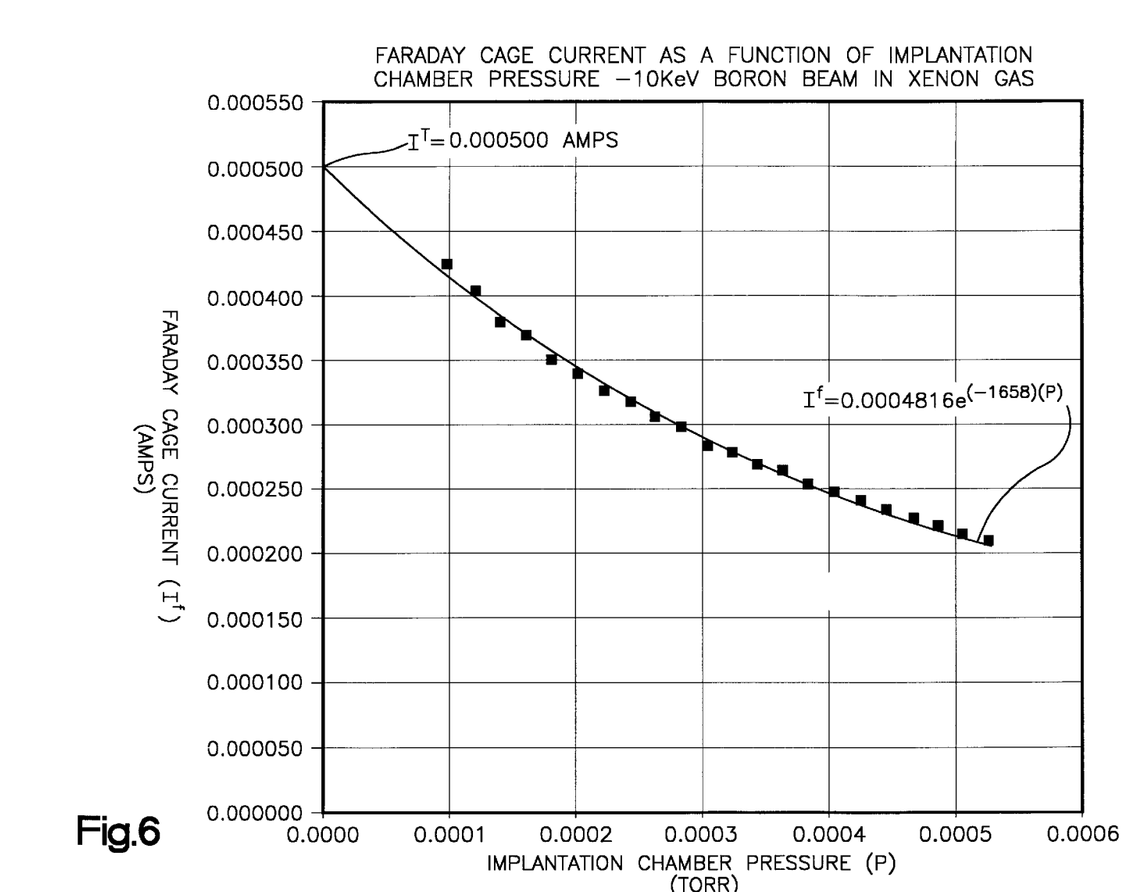
FIG. 6 is a graph showing ionized ion beam current, $I^+$, as a function of implantation station pressure, P, for xenon test gas.

FIG. 6 illustrates the determination of a calibration constant or K value for xenon gas wherein a production run is planned using a 10 kiloelectron volts (KeV) beam line with boron as the beam (boron trifluoride ($BF_3$) is the source gas introduced into the plasma chamber 28, the boron trifluoride being disassociated into elemental boron which enters the beam line 14). For a particular test gas, the ionized beam current, $I^f$, as measured by the Faraday cage 110, is plotted as a function of implantation station pressure, P. Under a range of pressure conditions normally experienced during production runs, an exponential equation of the following form has been found to provide the best fit of a continuous line to the data points:

$$I^f = Ae^{-(KP)}$$

Where K and A are constants determined by the data analysis software 57.

As can be seen in FIG. 6, at a theoretical pressure of 0.0 Torr, the extrapolated Faraday cage ion beam current, $I^f$, equals the effective ion beam current, $I^T$. This relation must be true since at P=0.0 Torr there is no residual gas in the interior region to collide with the ion beam 14, thus, the Faraday cage current must be equal to the effective ion beam current, $I^T = I^f$.

The curve fitting data analysis software 57 of the calibration circuitry 56 extracts the K value correlation between the Faraday ionized beam current, If, and the implantation chamber pressure, P, and generates a dosimetry calibration factor, that is, the K value for xenon test gas. For the xenon test gas, the best fit exponential equation determined by the data analysis software 57 is as follows:

$$I^f = 0.0004816\, e^{-(1658)(P)}$$

Where: $I^f$ is the ionized current (as measured by the Faraday cage 110);

P is the implantation station pressure; and

K, the calibration value, for xenon gas is 1658.

While in certain pressure ranges, a linear approximation of the relation of the relation between the ionized current, $I^f$, and the implantation station pressure P, is an acceptable approximation, it has been empirically found that an exponential equation results in the best fit, that is, minimizes the sum of the squared deviations of the actual ionized current, $I^f$, values from the values predicted by the exponential equation.

Certain semiconductor wafer workpieces 21 may include a photoresist coating. If such is the case, another calibration run is performed with a different test gas to find a K value corresponding to the composition of gas produced from outgassing from photoresist coating on the semiconductor wafer workpieces 21. Both of these K values would then be used in a subsequent production run by the dosage control circuitry 66 to calculate the effective ion beam current, $I^T$. It should be obvious to one skilled in the art that such calculation and utilization of K values could be extended to all residual gas components expected to be present in the implanter interior region 52 during a production run. Of course, it should be appreciated that a judgment must be made as to whether a residual gas component is "important" enough have it included in the calculation of the effective ion beam current, $I^T$, by the dosage control circuitry 66. Some residual gas components will account for such a small portion of the expected residual gas and have such a minimal effect on implantation dosage such that they will be deemed not important enough to include into the compensation process as herein described. Also, as will be explained below, if the calculation of the effective ion beam current, $I^T$, by the dosage control circuitry 66 involves more than one calibration or K value, an approximation must be made as to the proportion of the total pressure, P, in the implanter interior region 52 during a production run that is accounted for by each of the residual gas components verses other residual gas components whose presence is being corrected for.

Production Run Mode of Operation

During a production run, the restriction plate 70 is moved out of the beam line 14. Thus, the pressure, P, measured in the implantation chamber 22 is present throughout the ion beam implanter interior region 52. The dosage control circuitry 66 monitors and controls the ion implantation dose received by the workpieces 21 during a production run. Specifically, the dosage control circuitry 66 monitors the ionized current, $I^f$, and the implantation station pressure, P, and utilizes one or more computed calibration values (K values) to determine the effective ion beam current, $I^T$. The calculation of $I^T$ is updated once per revolution of the support 90 during the production run to insure accurate control of beam dosage.

Upon determining the effective ion beam current, $I^T$, the dosage control circuitry 66 sends appropriate control signals to the motor control system 68. The motor control system 68 appropriately controls both the angular velocity of the rotation of the workpiece support 90 via the motor 92 and the vertical velocity of the support 90 via the stepper motor 98 to maintain a uniform implantation of the workpieces 21. The dosage control circuitry 66 also monitors the elapsed time of the implantation production run and stop implantation of the workpieces 21 at an appropriate time to insure that the desired or target ion dosage for each workpiece is accurately achieved in accordance with known practices for monitoring and control of implantation dose.

The general formulation for computing the effective ion beam current, $I^T$, is as follows:

$$I^T = I^f e^{-(K1\,P1)} e^{-(K2\,P2)} \ldots e^{-(Kn\,Pn)}$$

Where:

$I^T$ is the effective ion beam current for implantation of workpieces;

$I^f$ is the ionized current (as measured by the Faraday cage 110);

K1 is the calibration value of a test gas corresponding to a first residual gas expected to be present in the implantation station during a production run;

P1 is the implantation station pressure due to the first residual gas;

K2 is the calibration value of a test gas corresponding to a second residual gas expected to be present in the implantation station during the production run;

P2 is the implantation station pressure due to the second residual gas;

Kn is the calibration value of a test gas corresponding to a nth residual gas expected to be present in the implantation station during the production run; and Pn is the implantation station pressure due to the nth residual gas.

Of course it should be appreciated that the total pressure, P, in the implantation chamber 22 at any given time t during a production run is the sum of the fractionate residual gas component pressures, P=P1+P2+...+ Pn present at that time t. Each of the residual gas components pressure values, P1, P2, . . . , Pn, must be approximated by estimating the proportional share of the total pressure accounted for by each of the residual gas components present in the interior region 52 at time t during a production run. One simplification is to assume that the proportional share of each residual gas component of the total implantation chamber pressure P remains constant during the production run. That is, if P1 is estimated as accounting for 40% of the total pressure, P, present in the implantation station 22, that 40% would be assumed to be constant at any time t during a production run.

Of course, depending on the characteristics of the source gas or gases and workpiece characteristics, the number of K values selected to be used in the above current correction equation will vary from production run to production run. For example, in a given production run, using only the xenon gas calibration K value may be sufficient adequately compensate for residual gas effects. In such a situation, the formula for the effective ion beam current, $I^T$, would simplify to:

$$I^T = I^f e^{-(K(xenon)\,P)}$$

Where:

$I^T$ is the effective ion beam current for implantation of workpieces;

$I^f$ is the ionized current (as measured by the Faraday cage 110);

P is the total implantation station pressure; and

K is the calibration value for xenon gas, namely, −1658.

In other production runs, it may be determined that using only the xenon gas and photoresist outgas calibration K values may be sufficient to adequately compensate for residual gas effects in the interior region 52. In such a situation, the formula for the effective ion beam current would simplify to:

$$I^T = I^f e^{-(K(xenon)P(xenon))} e^{-(K(photoresist)P(photoresist))}$$

Where:

$I^T$ is the effective ion beam current for implantation of workpieces;

$I^f$ is the ionized current (as measured by the Faraday cage 110);

P(xenon) is the implantation station pressure attributable to residual gas comprising xenon gas;

K(xenon) is the calibration value, for xenon gas, namely, 1658.

P(photoresist) is the implantation station pressure attributable to residual gas comprising photoresist outgas; and K(photoresist) is the calibration value for photoresist outgas.

It should be understood, of course, that the total instantaneous pressure P of the implanter interior region 52 at any arbitrary time t during a production run is comprised of all the residual gas components present in the interior region 52, not just the pressures attributable to the xenon and photoresist gas components. As set forth above, P=P1+P2+. . . + Pn. To simplify the analysis, an estimate of the proportional share, PS(xenon) and PS(photoresist) of xenon versus photoresist residual gases can be made assuming these are the only two residual gases present during a production. The proportional shares can be used to calculate pressure values for P(xenon) and P(photoresist) given any measured implanter chamber pressure P. For example, if it is estimated that PS(xenon)=70% and PS(photoresist)=30% if these were the only two residual gases present in the interior region 52, then, for purposes of calculating the effective beam current, $I^T$, the residual xenon gas pressure, P(xenon), would be calculated from the total pressure, P, as follows:

P(xenon)=0.70×P and the residual photoresist gas pressure, P(photoresist), would be calculated from the total pressure, P, as follows:

P(photoresist)=0.30×P

While the invention has been described herein in it currently preferred embodiment or embodiments, those skilled in the art will recognize that other modifications may be made without departing from the invention and it is intended to claim all modifications and variations as fall within the scope of the invention.

We claim:

1. An ion beam implanter for directing an ion beam against a workpiece, the implanter comprising:
    a) an implantation station defining an implantation chamber, the workpiece supported within the implantation chamber;
    b) an ion source generating the ion beam;
    c) beam forming and directing apparatus defining an ion beam implanter interior region through which the ion beam passes from the ion source to the implantation station
    d) a pressure regulation system for pressurizing and depressurizing the ion beam implanter interior region; and
    e) dosage control assembly for controlling a dosage of ions implanted into the workpiece, the dosage control assembly including:
        1) pressure measuring apparatus for measuring a pressure in the implantation chamber;
        2) ion beam current measuring apparatus for measuring an ionized current of the ion beam;
        3) a restriction plate having an aperture and being movable between a production run position and a calibration position, in the production run position, the restriction plate being out of a beam line of the ion beam and in the calibration position, the restriction plate being in the beam line of the ion beam such that a portion of the ion beam traverses the restriction plate aperture and is directed to the implantation chamber, the restriction plate in the calibration position sealing against the beam forming and directing apparatus to divide the ion beam implanter interior region into a first region including the implantation chamber and a second region; and
        4) control circuitry coupled to the pressure regulation system, pressure measuring apparatus and ion beam current measuring apparatus, the control circuitry operating during a calibration run to change a pressure of a test gas in the first region between a plurality of pressure values, measure an ionized current value corresponding to each of the plurality of pressure values and calculate a calibration value correlating the ionized current values to the plurality of pressure values; and
        5) the control circuitry operating during a production run to control ion dosage received by the workpiece using the calibration value to calculate an effective ion beam current.

2. The ion beam implanter of claim 1 wherein the ion beam current measuring apparatus is a Faraday cage.

3. The ion beam implanter of claim 1 wherein the test gas in the first region is comprised of a gas having the same composition as at least one residual gas present in the ion beam implanter interior region during the production run.

4. The ion beam implanter of claim 1 wherein the control circuitry includes calibration circuitry to calculate the calibration value by generating an equation relating ionized current magnitude to test gas pressure magnitude in the implantation chamber, the equation based on fitting a continuous curve to the plurality of pressure values and corresponding ionized current values.

5. The ion beam implanter of claim 4 wherein the continuous curve is an exponential curve of the form $I^f = A e^{-(KP)}$, where $I^f$ is ionized current magnitude, P is test gas pressure magnitude in the implantation chamber, K is the calibration constant and A is a constant.

6. The ion beam implanter of claim 1 wherein the control circuitry includes dosage control circuitry which utilizes an equation relating effective ion beam current magnitude to ionized current magnitude, test gas pressure magnitude and the calibration value.

7. The ion beam implanter of claim 6 wherein the equation is of the form $I^T = I^f e^{-(KP)}$, where $I^T$ is effective ion beam current magnitude, $I^f$ is ionized current magnitude, P is test gas pressure magnitude in the implantation chamber and K is the calibration value.

8. A ion beam dosage control assembly for an ion beam implanter, the dosage control assembly comprising:

a) pressure measuring apparatus for measuring a pressure in a workpiece ion implantation chamber of the implanter;

b) ion beam current measuring apparatus for measuring an ionized current of an ion beam generated by the implanter;

c) a restriction plate having an aperture and being movable between a production run position and a calibration position, in the production run position, the restriction plate being out of a beam line of the ion beam and in the calibration position, the restriction plate being in the beam line of the ion beam such that a portion of the ion beam traverses the restriction plate aperture and is directed to the implantation chamber, the restriction plate in the calibration position sealing against beam forming and directing apparatus of the implanter to divide an interior region of the implanter into a first region including the implantation chamber and a second region; and d) control circuitry operatively coupled to the pressure measuring apparatus, the ion beam current measuring apparatus and a pressure regulation system of the implanter, the control circuitry operating during a calibration run to change a pressure of a test gas in the first region between a plurality of pressure values, measure an ionized current value corresponding to each of the plurality of pressure values and calculate a calibration value correlating the ionized current values to the plurality of pressure values; and e) the control circuitry operating during a production run to control ion dosage received by the workpiece using the calibration value to calculate an effective ion beam current.

9. The ion beam dosage control assembly of claim 8 wherein the ion beam current measuring apparatus is a Faraday cage.

10. The ion beam dosage control assembly of claim 8 wherein the test gas in the first region is comprised of a gas having the same composition as at least one residual gas present in the ion beam implanter interior region during the production run.

11. The ion beam dosage control assembly of claim 8 wherein the control circuitry includes calibration circuitry to calculate the calibration value by generating an equation relating ionized current magnitude to test gas pressure magnitude in the implantation chamber, the equation based on fitting a continuous curve to the plurality of pressure values and corresponding ionized current values.

12. The ion beam dosage control assembly of claim 11 wherein the continuous curve is an exponential curve of the form $I^f = A e^{-KP}$, where $I^f$ is ionized current magnitude, P is test gas pressure magnitude in the implantation chamber, K is the calibration value and A is a constant.

13. The ion beam dosage control assembly of claim 8 wherein the control circuitry includes dosage control circuitry which utilizes an equation relating effective ion beam current magnitude to ionized current magnitude, test gas pressure magnitude and the calibration value.

14. The ion beam dosage control assembly of claim 13 wherein the equation is of the form $I^T = I^f e^{-(KP)}$, where $I^T$ is effective ion beam current magnitude, $I^f$ is ionized current magnitude, P is test gas pressure magnitude in the implantation chamber and K is the calibration value.

15. A method of controlling ion beam dose received by a workpiece disposed in an implantation station in an ion beam implanter during a production run, the steps of the method comprising:

a) changing a pressure of a test gas in the implantation station between a plurality of pressure values, the test gas comprised of a gas having the same composition as at least one residual gas present in the ion beam implanter interior region during the production run;

b) measuring an ionized current value corresponding to each of the plurality of pressure values;

c) calculating a calibration value correlating the ionized current values to the plurality of pressure values;

d) using the calibration value to calculate an effective ion beam current; and e) using the effective ion beam current to control workpiece ion beam dosage.

16. The method of controlling ion beam dose as set forth in claim 15 wherein the step of calculating the calibration value includes generating an equation relating ionized current magnitude to test gas pressure magnitude in the implantation chamber, the equation based on fitting a continuous curve to the plurality of pressure values and corresponding ionized current values.

17. The method of controlling ion beam dose as set forth in claim 16 wherein the continuous curve is an exponential curve of the form $I^f = A e^{-(KP)}$, where $I^f$ is ionized current magnitude, P is test gas pressure magnitude in the implantation chamber, K is the calibration value and A is a constant.

18. The method of controlling ion beam dose as set forth in claim 15 wherein the step of using the calibration value to calculate an effective ion beam current includes the use of an equation relating effective ion beam current magnitude to ionized current magnitude, test gas pressure magnitude and the calibration value.

19. The method of controlling ion beam dose as set forth in claim 18 wherein the equation is of the form $I^T = I^f e^{-(KP)}$, where $I^T$ is effective ion beam current magnitude, $I^f$ is ionized current magnitude, P is test gas pressure magnitude in the implantation chamber and K is the calibration value.

* * * * *